United States Patent
Yoon (10) Patent No.: US 9,471,517 B1
(45) Date of Patent: Oct. 18, 2016

(54) MEMORY SYSTEM, MEMORY MODULE AND METHOD TO BACKUP AND RESTORE SYSTEM USING COMMAND ADDRESS LATENCY

(71) Applicant: SK hynix Inc., Gyeonggi-do (KR)

(72) Inventor: Hyun-Ju Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/845,870

(22) Filed: Sep. 4, 2015

(30) Foreign Application Priority Data

Apr. 14, 2015 (KR) ............... 10-2015-0052427

(51) Int. Cl.
- *G06F 13/16* (2006.01)
- *G06F 13/40* (2006.01)
- *G11C 15/04* (2006.01)
- *G11C 8/18* (2006.01)

(52) U.S. Cl.
CPC ......... *G06F 13/161* (2013.01); *G06F 13/1657* (2013.01); *G06F 13/1694* (2013.01); *G06F 13/404* (2013.01); *G11C 8/18* (2013.01); *G11C 15/046* (2013.01)

(58) Field of Classification Search
CPC ............ G06F 13/161; G06F 13/1657; G06F 13/1694; G06F 13/36; G06F 13/362; G06F 13/3625; G11C 8/18; G11C 15/046; G11C 7/10
See application file for complete search history.

(56) References Cited

U.S. PATENT DOCUMENTS

| | | | | |
|---|---|---|---|---|
| 2005/0262323 A1* | 11/2005 | Woo | ............... | G06F 13/1631 711/167 |
| 2012/0271990 A1* | 10/2012 | Chen | ............... | G06F 11/1441 711/103 |
| 2013/0028039 A1* | 1/2013 | Wang | ............... | G11C 11/4072 365/226 |
| 2014/0215277 A1* | 7/2014 | Judd | ............... | G06F 11/2284 714/42 |
| 2015/0006815 A1* | 1/2015 | Madhusudana | ..... | G06F 12/0866 711/114 |
| 2015/0089287 A1* | 3/2015 | Jayakumar | ............... | G06F 1/30 714/23 |
| 2015/0127890 A1* | 5/2015 | Brainard | ............. | G06F 13/1694 711/103 |

FOREIGN PATENT DOCUMENTS

KR    1020150061286    6/2015

OTHER PUBLICATIONS

JEDEC Solid State Technology Association, "DDR4 SDRM: JESD79-4", rev. Sep. 2012, pp. 9-10, 13-14, 56-61.*
Jacob, B., Wang, D., and Ng, S., "Memory Systems: Cache, DRAM, Disk", 2008, Elsevier Inc., p. 428-432, retrieved online from ScienceDirect.*

(Continued)

*Primary Examiner* — Reginald Bragdon
*Assistant Examiner* — Aaron D Ho
(74) *Attorney, Agent, or Firm* — IP & T Group LLP (57) ABSTRACT

A memory system having a plurality of memory devices includes a controller for separately accessing the memory devices. The memory system includes a data bus for transferring data, a control bus for transferring a command and address CAL, and first and second memory devices coupled to the data bus and the control bus. The controller controls the first and second memory devices through the data bus and the control bus, wherein the first and second memory devices have different values of the CAL, and wherein a difference of the CAL values is greater than or equal to a RAS to CAS delay time tRCD.

19 Claims, 10 Drawing Sheets

(56) References Cited

OTHER PUBLICATIONS

Taassori, M., Chatterjee, N., Shafiee, A., and Balasubramonian, R., "Exploring a Brink-of-Failure Memory Controller to Design an Approximate Memory System", 1st Workshop on Approximate Computing Across the System Stack (WACAS), held in conjunction with ASPLOS-19, Salt Lake City, Mar. 2014.*

FuturePlus Systems Corporations, "Descriptions of DDR3 Bus Violation Parameters for the FS2800 DDR Detective", 2010, FuturePlus Systems.*

Micheletti, M., "Tuning DDR4 for Power and Performance", Aug. 16, 2013, In MemCon 2013, slides 17-20.*

Per DRAM Addressability, JEDEC Standard DDR4 SDRAM, Sep. 2012, JESD79-4, JEDEC Solid State Technology Association.

* cited by examiner

MEMORY SYSTEM, MEMORY MODULE AND METHOD TO BACKUP AND RESTORE SYSTEM USING COMMAND ADDRESS LATENCY

CROSS-REFERENCE TO RELATED APPLICATIONS

The present application claims priority of Korean Patent Application No. 10-2015-0052427, filed on Apr. 14, 2015, which is incorporated herein by reference in its entirety.

BACKGROUND

1. Field

This patent document relates to a memory system and a memory module.

2. Description of the Related Art

In most cases, a single controller is used to control multiple memory devices.

Figure 1:
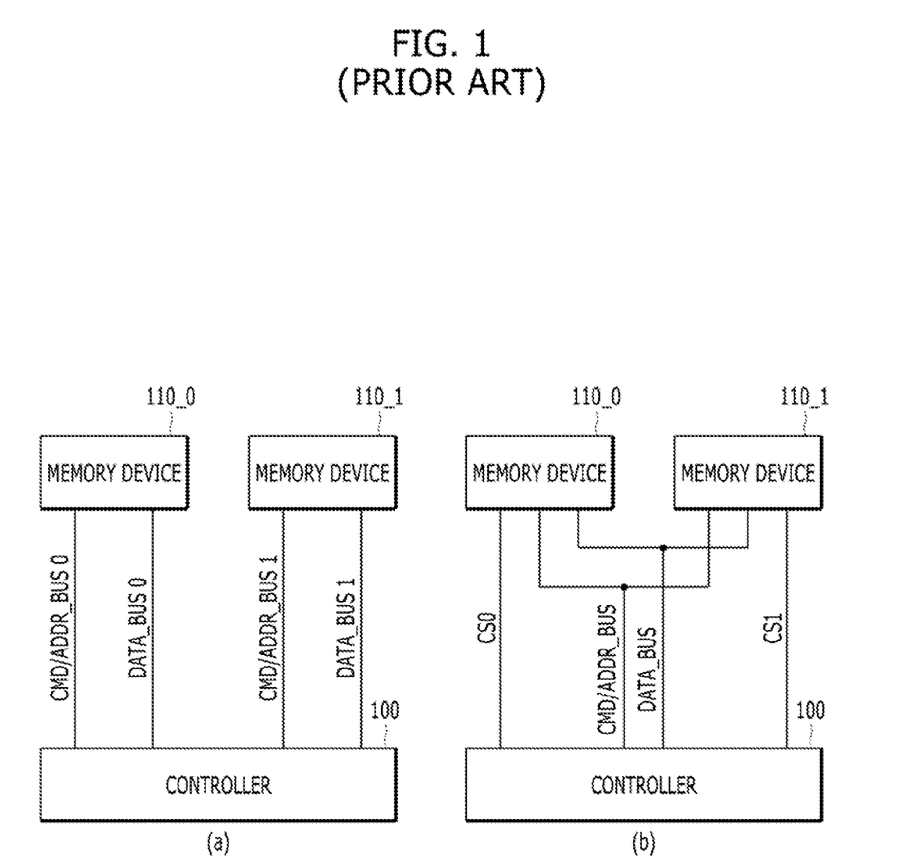
FIG. 1 is a diagram illustrating bus coupling between a controller and memory devices in a conventional memory system.

As illustrated in FIG. 1A, when a control bus CMD/ADDR_BUS0 and a data bus DATA_BUS 0 between a controller 100 and a memory device 110_0 are separated from a control bus CMD/ADD_BUS1 and a data bus DATA_BUS1 between the controller 100 and a memory device 110_1, the controller 100 can separately control the memory devices 110_0 and 110_1. A command and address are transmitted through the control bus. For example, while the memory device 110_0 performs a read operation, the memory device 110_1 may perform a write operation.

As illustrated in FIG. 1B, when a control bus CMD/ADDR_BUS and a data bus DATA_BUS are shared by the memory devices 110_0 and 110_1, lines for transmitting signals CS0 and CS1 for distinguishing between the memory devices 110_0 and 110_1 are provided. The lines for transmitting the signals CS0 and CS1 among signals of the control bus CMD/ADDR_BUS are separately provided for the respective memory devices 110_0 and 110_1. In this case, a memory device selected by the signals CS0 and CS1 between the memory devices 110_0 and 110_1 may perform an operation in response to the command transferred through the control bus CMD/ADDR_BUS, and exchange signals with the controller 100 through the data bus DATA_BUS. The signals CS0 and CS1 are command signals transmitted to the control bus CMD/ADD_BUS, but are independently allocated to the memory devices 110_0 and 110_1 unlike the other common command signals transmitted through the control bus CMD/ADDR_BUS. Thus, the signals CS0 and CS1 are separately illustrated in FIG. 1B.

As the number of memory devices coupled to the controller increases, the number of lines required increases. This lead to increase difficulties in system design as well as increased manufacturing costs.

SUMMARY

Various embodiments are directed to a memory system which includes a controller capable of separately accessing memory devices, while reducing the number of lines between the controller and memory devices.

In an embodiment, a memory system may include: a data bus suitable for transferring data; a control bus suitable for transferring commands and addresses including a command address latency (CAL); first and second memory devices commonly coupled to the data bus and the control bus; and a controller suitable for controlling the first and second memory devices through the data bus and the control bus, wherein the first and second memory devices have different values of the CAL, and wherein a difference of the CAL values is greater than or equal to a RAS to CAS delay time (tRCD).

The difference of the CAL values is smaller than a row precharge time (tRP).

In an embodiment, a memory module may include: a first data bus suitable for transferring data; a control bus suitable for transferring commands and addresses including a command address latency (CAL); a plurality of first volatile memory devices commonly coupled to the first data bus and the control bus; one or more nonvolatile memory devices; and a controller suitable for providing the commands and addresses through the control bus and the first data bus to store data of the plurality of first volatile memory devices into the nonvolatile memory devices when a trigger condition is satisfied, wherein when the trigger condition is satisfied, the controller controls a specific one of the plurality of first volatile memory devices to have the CAL of a first value, and the others of the plurality of first volatile memory devices to have the CAL of a second value.

The commands and addresses may include the CLA of the first value when the controller accesses the specific one of the plurality first volatile memory devices.

The memory system may further include: a second data bus suitable for transferring data; and a plurality of second nonvolatile memory devices commonly coupled to the second data bus and the control bus, wherein the controller further provides the command and address through the control bus and the second data bus to store data of the plurality of second volatile memory devices into the nonvolatile memory devices, when the trigger condition is satisfied, and wherein when the trigger condition is satisfied, the controller controls a specific one of the plurality of second volatile memory devices to have the CAL of the first value, and the others of the plurality of second volatile memory devices to have the CAL of a second value.

The command and address may include the CAL of the first value when the controller accesses the specific one of the plurality of second volatile memory devices.

In an embodiment, there is provided an operation method of a memory module including first to Nth volatile memory groups, each of which includes one or more volatile memory devices, one or more nonvolatile memory devices, and a controller. The operation method may include: exchanging data between the first to Nth volatile memory groups and a memory controller of a host; controlling, by the controller, a specific one of the first to Nth volatile memory groups to have a command address latency (CAL) of a first value, and the others of the first to Nth volatile memory groups to have the CAL of a second value when a trigger condition is satisfied; and providing commands and addresses including the CAL of the first value to store data of the specific one of the first to Nth volatile memory groups into the nonvolatile memory devices when the trigger condition is satisfied.

The operation method may further include: controlling, by the controller, the specific one of the first to Nth volatile memory groups to have the CAL of a third value, and the others of the first to Nth volatile memory groups to have the CAL of a fourth value when a restoration condition is satisfied; and providing commands and addresses including the CAL of the third value to restore data of the nonvolatile memory devices into the specific one of the first to Nth volatile memory groups when the restoration condition is satisfied.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Before embodiments of the present invention are described, a Per DRAM Addressability (PDA) mode and Command Address Latency (CAL) of a memory device will be described as follows.

Figure 2:
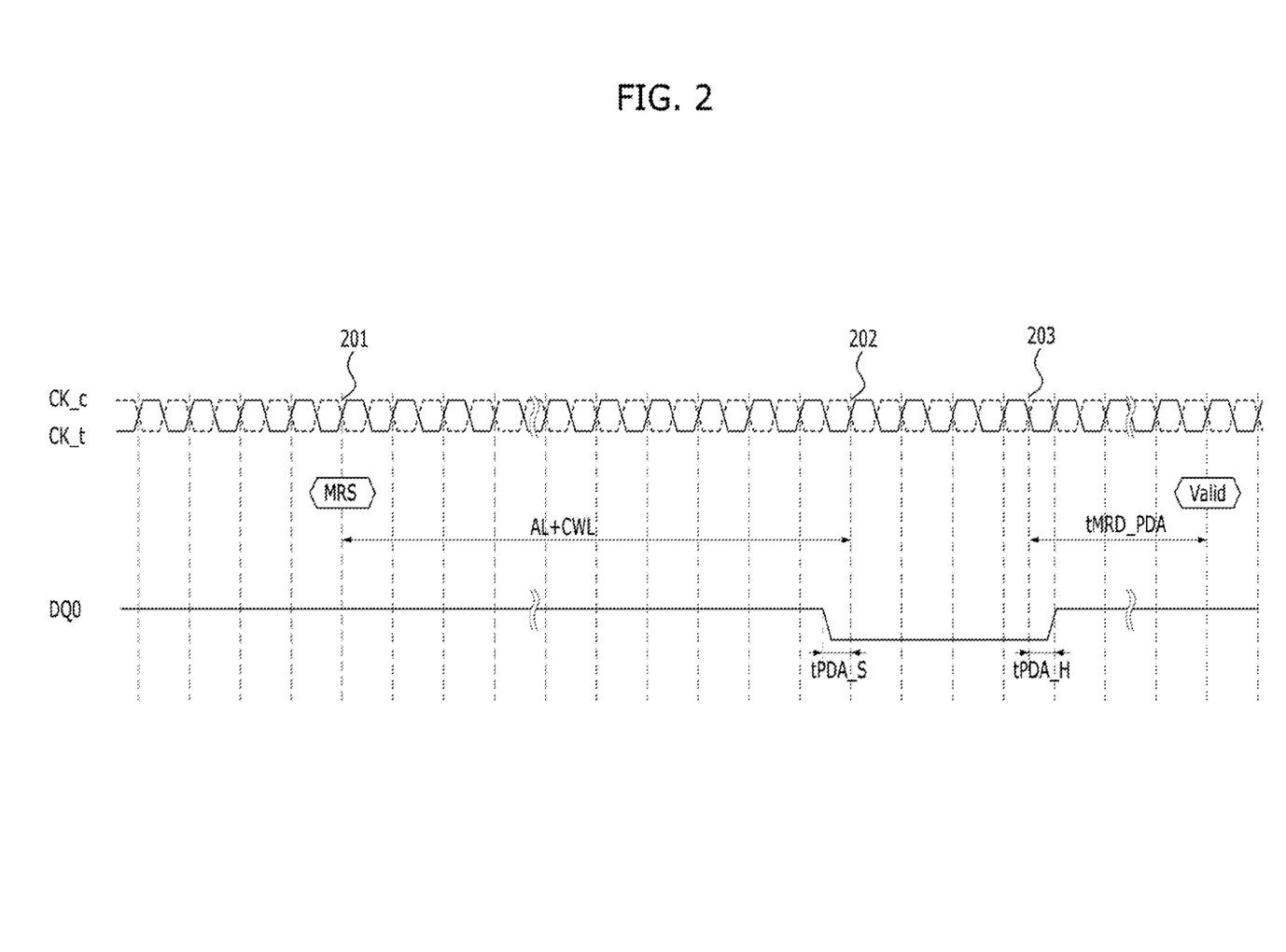
FIG. 2 is a timing diagram illustrating an operation according to a MRS during a PDA mode in a memory device.

FIG. 2 is a timing diagram illustrating an operation according to a mode register set (MRS) during the PDA mode in a memory device.

During the PDA mode, memory devices may be enabled to perform independent MRS operations. When the PDA mode is set, the validities of all MRS commands can be determined according to the signal level of a zeroth data pad DQ0. When the signal level of the zeroth data pad DQ0 is '0' after the write latency WL, which is sum of the Additive Latency (AL) and the CAS Write Latency (CWL) from the time point at which a MRS command is applied, the applied MRS set command may be determined to be valid. When the signal level of the zeroth data pad DQ0 is '1' after the write latency WL from the time point at which the MRS command is applied, the applied MRS command may be determined to be invalid and then ignored.

Referring to FIG. 2, the MRS command MRS may be applied to a memory device at a time point 201. At a time point 202 or the write latency (WL=AL+CWL) after the time point 201, the signal level of the zeroth data pad DQ0 may transition to '0' during a predetermined period. Thus, the MRS command MRS applied at the time point 201 may be determined to be valid, and a setting operation of the memory device using an address (not illustrated) inputted with the MRS command may be performed during a MRS command cycle time tMRD_PDA from a time point 203.

When the signal level of the zeroth data pad DQ0 is continuously retained as '1' at the time point 202, the MRS command MRS applied at the time point 201 may be determined to be invalid and ignored. That is, a setting operation of the memory device may not be performed.

Figure 3:
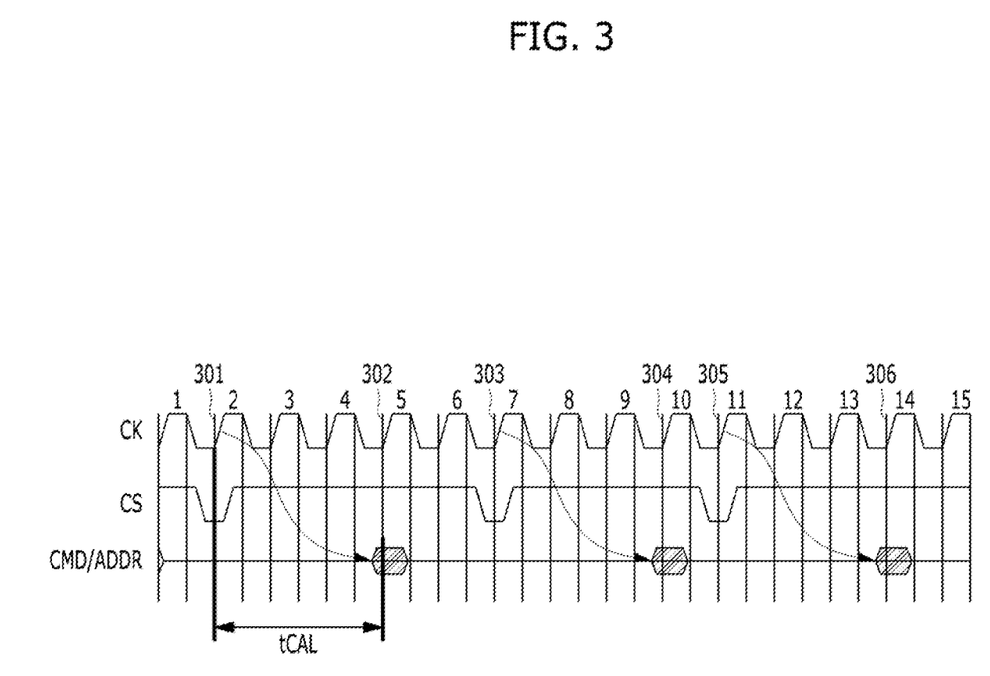
FIG. 3 is a diagram illustrating command address latency CAL of a memory device.

FIG. 3 is a diagram illustrating the CAL of the memory device.

The CAL indicates a timing difference between a chip select signal and the other control signals of the control signals transmitted to the control bus CMD/ADDR_BUS. When the CAL is set, the memory device may take valid control signals, which are inputted the CAL after the enablement of the chip select signal CS. The value of the CAL may be set by the MRS.

FIG. 3 illustrates an operation when the CAL is set to three clock cycles. The chip select signal CS may be low-enabled at time points 301 and 305. At a time point 302 where three clocks have elapsed from the time point 301, the command CMD, except for the chip select signal CS, and address ADDR may be applied to the memory device. Then, the memory device may recognize that the command CMD and address ADDR applied at the time point 302 are valid. Although the command CMD and address ADD are applied to the memory device at the same time point as the time point 301 or at a time point where one or two clocks have elapsed from the time point 301, the memory device may recognize that the command CMD and address ADD are invalid.

Since the command CMD and address ADDR are applied at time points 304 and 306 or the three clocks of the CAL after the time points 303 and 305, the memory device may recognize that the command CMD and address ADDR applied at the time points 304 and 306 are valid.

Figure 4:
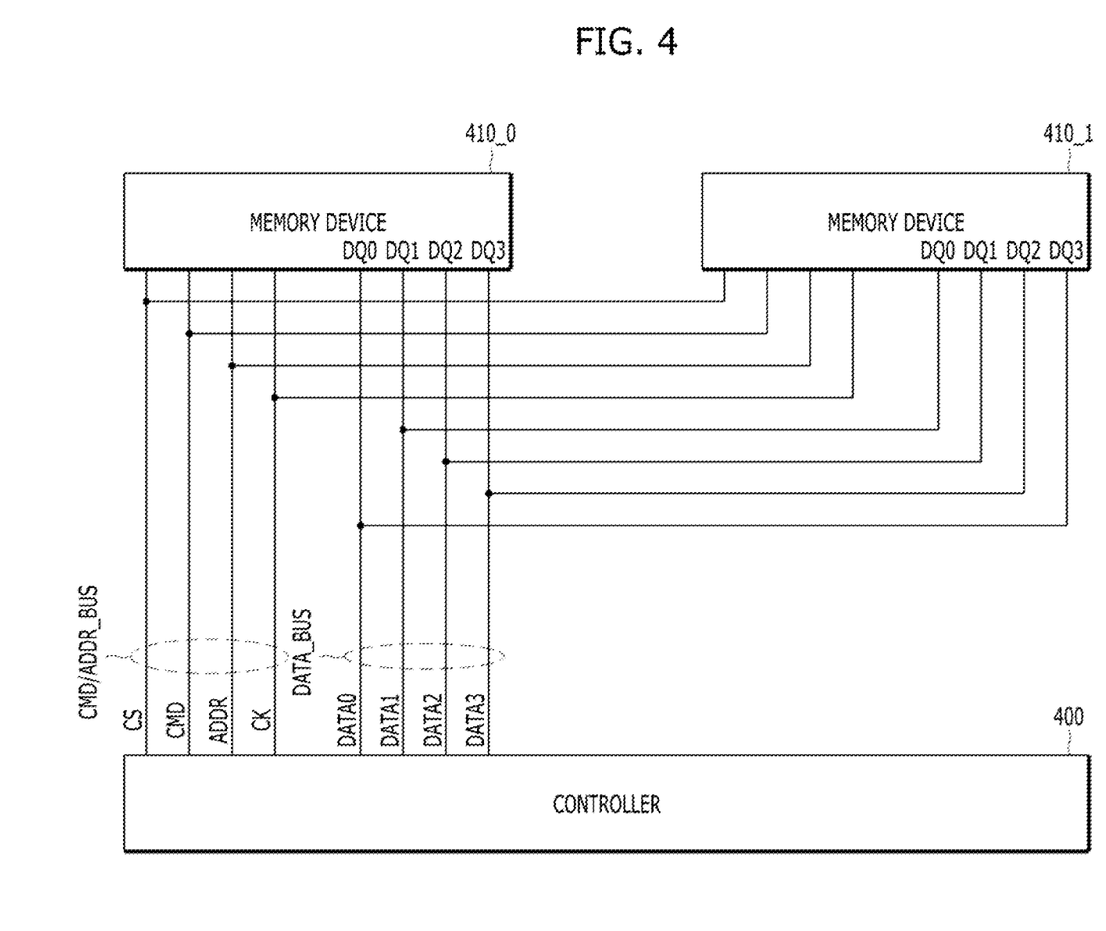
FIG. 4 is a block diagram illustrating a memory system in accordance with an embodiment of the present invention.

FIG. 4 is a block diagram illustrating a memory system in accordance with an embodiment of the present invention.

Referring to FIG. 4, the memory system may include a controller 400, a first memory device 410_0, a second memory device 410_1, a control bus CMD/ADDR_BUS, and a data bus DATA_BUS.

Through the control bus CMD/ADDR_BUS, the control signals may be transmitted to the memory devices 410_0 and 410_1 from the controller 400. The control signals may include the command CMD, an address ADDR, and a clock CK. The command CMD may include a plurality of signals. For example, the command may include an active command ACT, a row address strobe signal RAS, a column address strobe signal CAS, and the chip select signal CS. Although the chip select signal CS is included in the command CMD, FIG. 4 separately illustrates the chip select signal CS in order to indicate that the memory devices 410_0 and 410_1 share the same chip select signal CS. The address ADDR may include a plurality of signals. For example, the address ADDR may include a multi-bit bank group address, a multi-bit bank address, and a multi-bit normal address. For a synchronized operation of the memory devices, the clock CK may be transmitted to the memory devices 410_0 and 410_1 from the controller 400. The clock CK may be transmitted through a differential method including a main clock CK_t and a sub clock CK_c obtained by inverting the main clock CK_t.

The data bus DATA_BUS may transfer multi-bit data DATA0 to DATA3 between the controller 400 and the memory devices 410_0 and 410_1. Each of the memory devices 410_0 and 410_1 may include data pads DQ0 to DQ3 coupled to data lines DATA0 to DATA3 of the data bus DATA_BUS. The memory devices 410_0 and 410_1 may share the data bus DATA_BUS, but may be coupled to the data bus DATA_BUS with different data pads DQ0 to DQ3. For example, data pads DQ0 among the data pads DQ0 to DQ3 of the memory devices 410_0 and 410_1 may be coupled to different data lines DATA0 and DATA1, respectively. The specific data pad DQ0 may be used to set latency for recognizing the control signals of the control bus CMD/ADDR_BUS.

The controller 400 may control the memory devices 410_0 and 410_1 through the control bus CMD/ADDR_BUS, and exchange data with the memory devices 410_0 and 410_1 through the data bus DATA_BUS. The controller 400 may be included in a processor such as a Central Processing Unit (CPU), a Graphic Processing Unit (GPU), or an Application Processor (AP), or exist on a memory module such as a Dual In-line Memory Module (DIMM). Furthermore, the controller 400 may exist in various types. For example, the controller 400 may exist on a separate chip in a system including a memory device (for example, a computing device or mobile phone). The controller 400 may set latencies having various values at which the memory devices 410_0 and 410_1 recognize signals on the control bus CMD/ADDR_BUS. Then, the controller 400 may access a desired memory device between the memory devices 410_0 and 410_1 using the latencies. This operation will be described in detail with reference to FIGS. 5 to 7.

The first and second memory devices 410_0 and 410_1 may share the control bus CMD/ADDR_BUS and the data bus DATA_BUS. The first and second memory devices 410_0 and 410_1 may also share the line for the chip select signal CS. The first and second memory devices 410_0 and 410_1 may have different latencies to control signals transmitted through the control bus CMD/ADDR_BUS. The latency may indicate a timing difference between the chip select signal CS and the other signals CMD and ADDR of signals of the control bus CMD/ADDR_BUS. As different latencies are set for the control bus CMD/ADDR, the first and second memory devices 410_0 and 410_1 can be individually accessed by the controller 400. This operation will be described in detail with reference to FIGS. 5 to 7.

As illustrated in FIG. 4, separate signal transmission lines for each of the first and second memory devices 410_0 and 410_1 may not be allocated to the first and second memory devices 410_0 and 410_1 while the controller 400 can separately access the first and second memory devices 410_0 and 410_1. Hereafter, this operation will be described.

Figure 5:
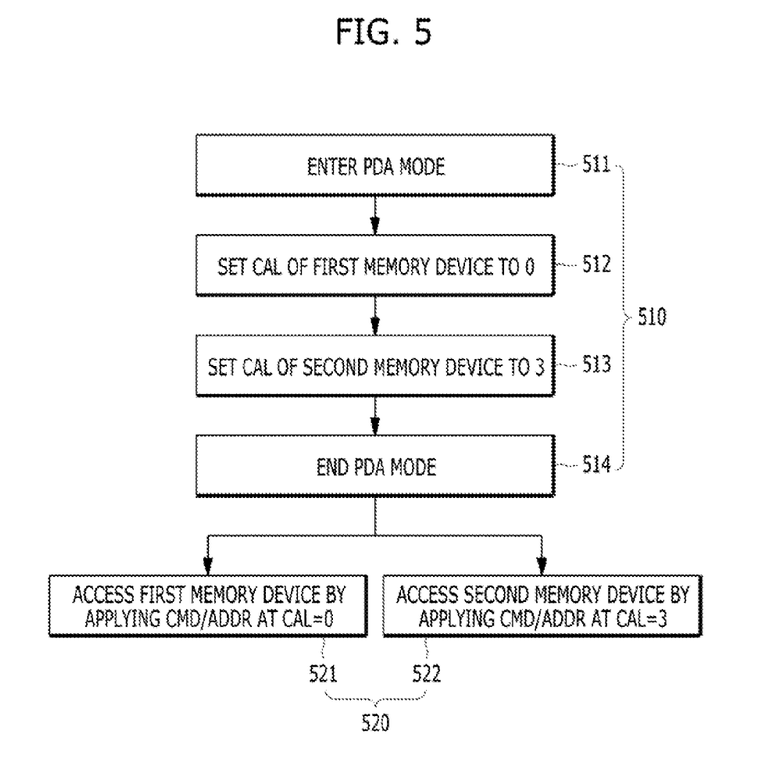
FIG. 5 is a flowchart illustrating an operation of the memory system of FIG. 4.

FIG. 5 is a flowchart illustrating the operation of the memory system described with reference to FIG. 4.

Referring to FIG. 5, the operation of the memory system may include an operation 510 in which the controller 400 differently sets the latencies for the control signals transmitted through the control bus CMD/ADDR_BUS of the first and second memory devices 410_0 and 410_1, and an operation 520 in which the controller 400 separately accesses the first and second memory devices 410_0 and 410_1. The operation 510 may include steps 511 to 514, and the operation 520 may include steps 521 and 522.

At step 511, the controller 400 may control the first and second memory devices 410_0 and 410_1 to enter the PDA mode by applying a command CMD corresponding to MRS and by applying an address ADDR corresponding to the entry of the PDA mode.

Figure 6:
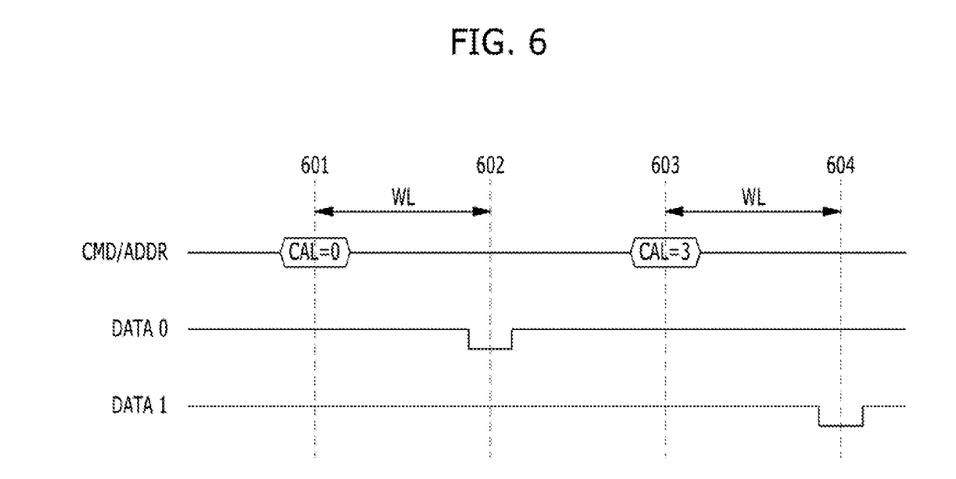
FIG. 6 is a timing diagram illustrating steps 512 and 513 of FIG. 5.

At step 512, the controller 400 may set the command address latency (CAL), which corresponds to the control bus CMD/ADDR_BUS of the first memory device 410_0, to '0' for example by applying the command CMD corresponding to MRS, by applying the address ADDR corresponding to the CAL set to '0', and by applying a signal of the zeroth data line DATA0 corresponding to the zeroth data pad DQ0 of the first memory device 410_0. The signal of the zeroth data line DATA0 may have a level of '0' the write latency (WL=AL+CWL) after the time point at which the command CMD is applied. Referring to FIG. 6, the command/address CMD/ADDR for setting the CAL to a level of '0' may be set at a time point 601, and the data line DATA0 may have a level of '0' at a time point 602 where the write latency WL has elapsed from the time point 601. Since the data line DATA1 has a level of '1' at the time point 602, the second memory device 410_1 may ignore the command applied at the time point 601.

At step 513, the latency corresponding to the control bus CMD/ADDR_BUS of the second memory device 410_1, that is, the CAL may be set to '3' by applying the command CMD corresponding to MRS, by applying the address ADDR corresponding to CAL set to '3', and by and applying a signal of the first data line DATA1 corresponding to the zeroth data pad DQ0 of the second memory device 410_1. The signal of the first data line DATA1 may have a level of '0' the write latency (WL=AL+CWL) after the time point at which the command CMD is applied. Referring to FIG. 6, the command/address CMD/ADDR for setting the CAL to a level '3' may be set at a time point 603, and the data line DATA1 may have a level of '0' at a time point 604 where the write latency WL has elapsed from the time point 603. Since the data line DATA0 has a level of '1' at the time point 604, the first memory device 410_0 may ignore the command applied at the time point 603. When the latency settings of the memory devices 410_0 and 410_1 are completed, the PDA mode may end at step 514.

Since the CALs of the first and second memory devices 410_0 and 410_1 are differently set, the controller 400 may access the first memory device 410_0 by applying the command/address CMD/ADDR at the enablement of the chip select signal CS at step 521, and access the second memory device 410_1 by applying the command/address CMD/ADDR after three clocks from the enablement of the chip select signal CS, at step 522.

Figure 7:
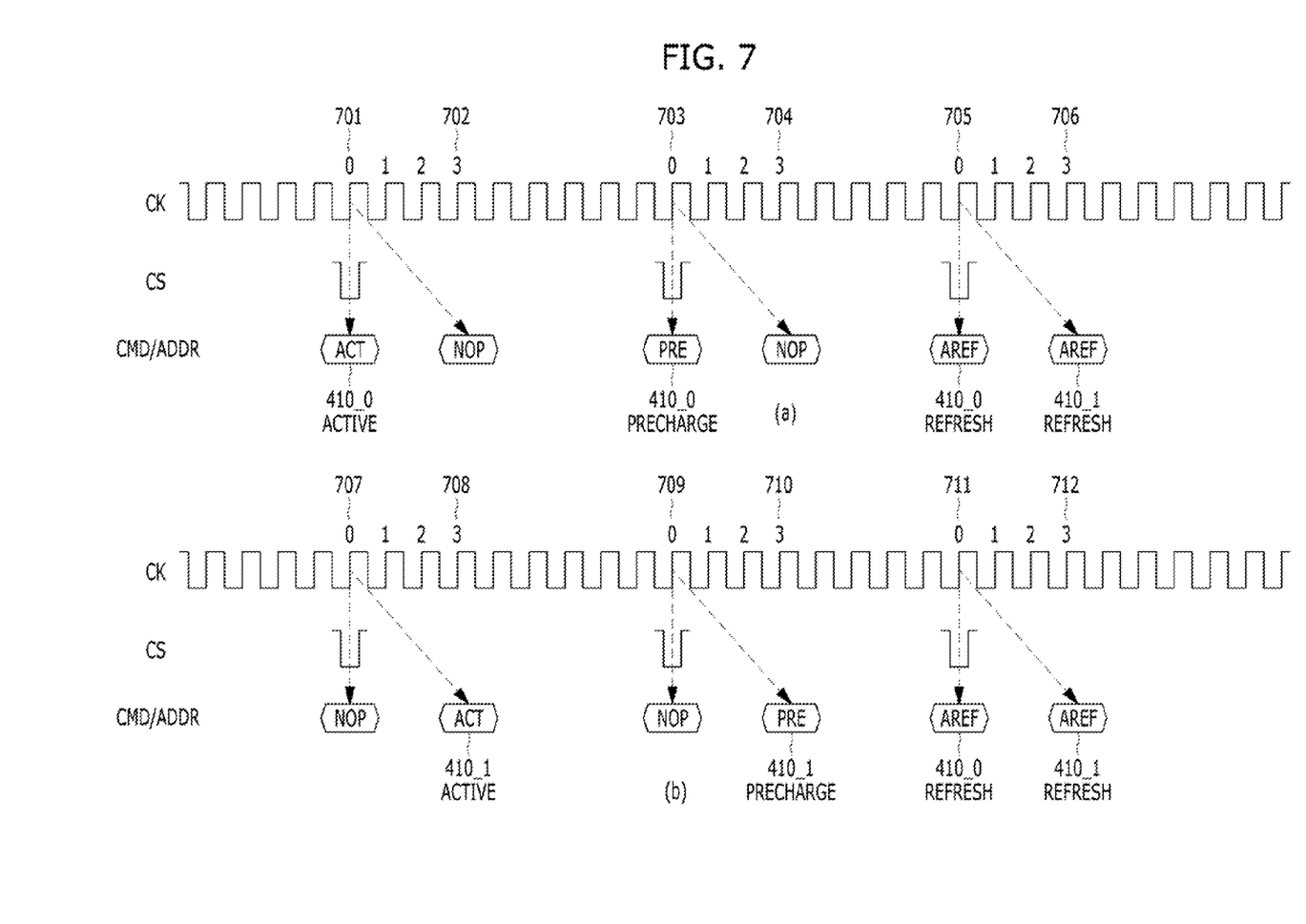
FIG. 7 is timing diagrams illustrating steps 521 and 522 of FIG. 5.

FIG. 7 shows timing diagrams illustrating steps 521 and 522 described with reference to FIG. 5. Referring to FIG. 7, the first memory device 410_0 may receive the commands applied at the time points 701, 703, 705, 707, 709, and 711, which is the same as the enablement time points of the chip select signal CS, and may start to operate. Furthermore, the second memory device 410_1 may receive the commands applied at time points 702, 704, 706, 708, 710, and 712 three clocks after the enablement time points of the chip select signal CS, and may start to operate. In FIG. 7, NOP represents a non-operation state in which no operation is ordered. At the time points 701, 702, 703, 704, 707, 708, 709, and 710, the controller 400 may access one of the first and second memory devices 410_0 and 410_1. However, at the time points 705, 706, 711, and 712, the controller 400 may access both of the first and second memory devices 410_0 and 410_1 by applying a valid command CMD at the enablement of the chip select signal CS and applying a valid command CMD at three clocks after the enablement of the chip select signal CS.

In accordance with the embodiment, the memory devices 410_0 and 410_1 may share the control bus CMD/AD- DR_BUS and the data bus DAT_BUS, but have different latencies for the control bus CMD/ADDR_BUS. Furthermore, the controller 400 may access one of the memory devices 410_0 and 410_1 by changing latencies of signals applied to the control bus CMD/ADDR_BUS. Thus, any further lines need not be added in order to individually control the memory devices 410_0 and 410_1.

In the above-described embodiment, it has been described that the controller 400 controls the memory devices 410_0 and 410_1 to have different latencies for the control bus CMD/ADDR_BUS, but this is only an example. The memory devices 410_0 and 410_1 may be programmed to permanently have different latencies. For example, when the memory devices 410_0 and 410_1 are fabricated, latencies for the control bus CMD/ADDR_BUS may be set. Alternatively, after the memory devices 410_0 and 410_1 are fabricated, latencies of the memory devices 410_0 and 410_1 for the control bus CMD/ADDR_BUS may be permanently set through a fuse circuit.

Figure 8:
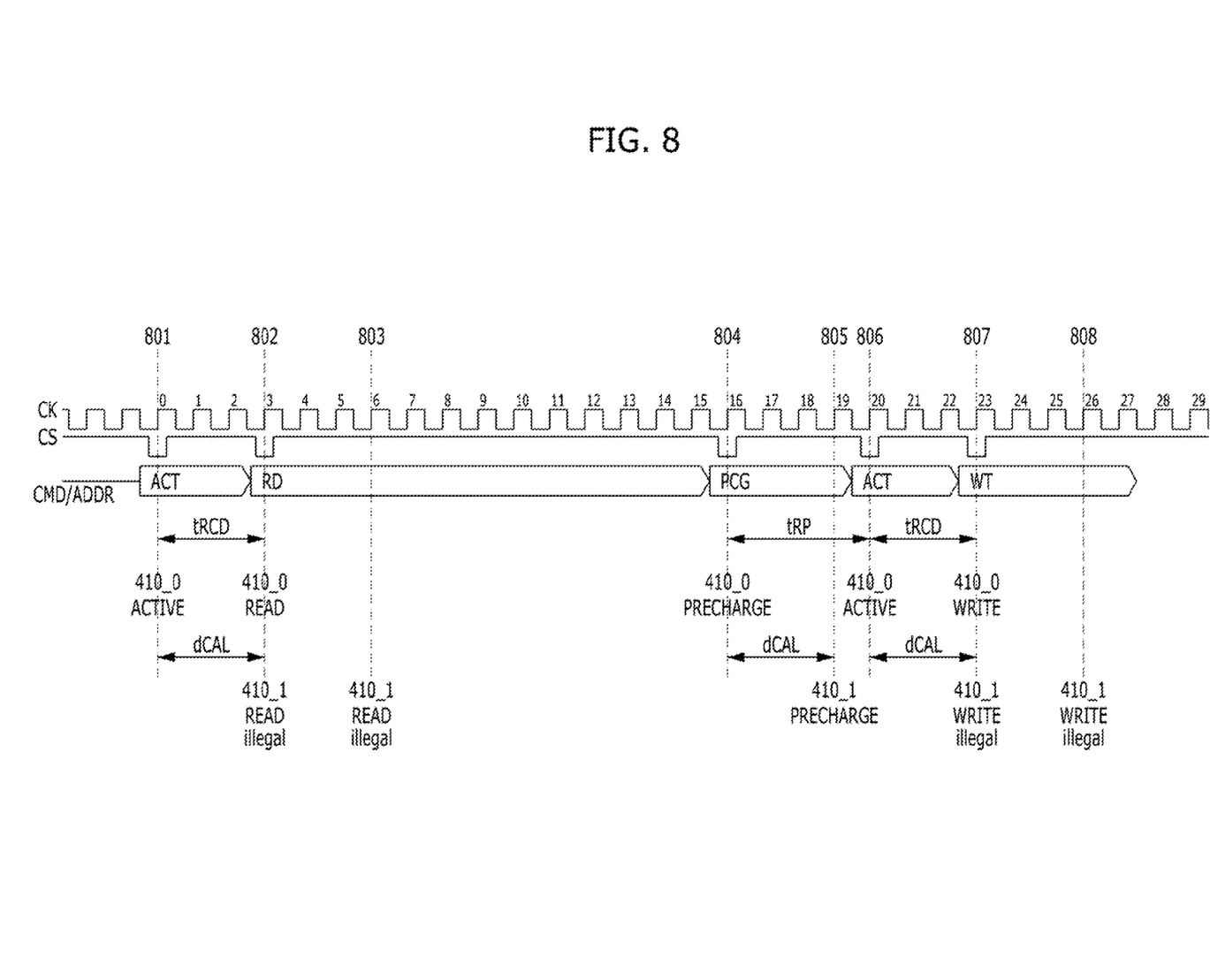
FIG. 8 is a diagram illustrating a CAL difference (dCAL) between memory devices, a RAS to CAS delay time (tRCD) and a row precharge time (tRP).

A difference in the CAL between the memory devices 410_0 and 410_1 may be greater than or equal to a RAS to CAS delay time (tRCD). Furthermore, the difference in the CAL between the memory devices 410_0 and 410_1 may be less than a row precharge time (tRP). That is, the following relation may be established: CAL difference dCAL≥tRCD and dCAL<tRP. FIG. 8 is a diagram illustrating the CAL difference (dCAL) between the first and second memory devices 410_0 and 410_1, the RAS to CAS delay time (tRCD) and the row precharge time (tRP). In FIG. 8, suppose that the CAL difference (dCAL) of the memory device 410_0 is set to 0, the CAL of the memory device 410_1 is set to 3, CAL difference (dCAL) is set to 3, the RAS to CAS delay time (tRCD) is set to 3, and the row precharge time (tRP) is set to 4.

Referring to FIG. 8, the chip select signal CS may be enabled, and an active command ACT may be transferred through the command/address CMD/ADDR at a time point 801. Then, the memory device 410_0 may perform an active operation in response to the active command ACT at the time point 801.

At a time point 802, the chip select signal CS may be enabled, and a read command RD may be transferred through the command/address CMD/ADDR. Then, the memory device 410_0 may perform a read operation in response to the read command RD at the time point 802. Furthermore, the memory device 410_1 may recognize the read command RD of the command/address CMD/ADDR at the time point 802, which is three clocks after the enablement time point 801 of the chip select signal CS. However, since the memory device 410_1 has never performed the active operation, the memory device 410_1 may void the read command RD ordered through the command/address CMD/ADDR without performing the read operation. When the CAL different dCAL is smaller than the RAS to CAS delay time tRCD, a malfunction may occur. For example, the memory device 410_1 may recognize the active command ACT ordered for the memory device 410_0. However, when the CAL difference dCAL is greater than or equal to the RAS to CAS delay time tRCD, such a malfunction may be prevented. Furthermore, the memory device 410_1 may recognize the read command RD of the command/address CMD/ADDR at a time point 803, which is three clocks after the enablement time point 802 of the chip select signal CS. However, since the memory device 410_1 has never performed the active operation, the memory device 410_1 may void the read command RD ordered through the command/address CMD/ADDR without performing the read operation.

At a time point 804, the chip select signal CS may be enabled, and the precharge command PCG may be ordered through the command/address CMD/ADDR. Then, the memory device 410_0 may perform the precharge operation in response to the precharge command PCG at the time point 804. Furthermore, the memory device 410_1 may recognize the precharge command PCG of the command/address CMD/ADDR, and perform the precharge operation at a time point 805, which is three clocks after the enablement time point 804 of the chip select signal CS. The precharge operation may be performed regardless of whether the previous active operation was performed. Thus, the memory device 410_1 can also perform the precharge operation.

At a time point 806, the chip select signal CS may be enabled, and an active command ACT may be ordered through the command/address CMD/ADDR. Then, the memory device 410_0 may perform an active operation in response to the active command ACT at the time point 806. When the CAL difference dCAL is set to be greater than tRP, a malfunction may occur. For example, the memory device 410_1 may perform an active operation in response to the active command ACT ordered through the command/address CMD/ADD from the time point 806. However, since the CAL difference dCAL is smaller than the row precharge time tRP, such a malfunction may be prevented.

At a time point 807, the chip select signal CS may be enabled, and a write command WT may be ordered through the command/address CMD/ADDR. Then, the memory device 410_0 may perform a write operation in response to the write command WT at the time point 807. Furthermore, the memory device 410_1 may recognize the write command WT of the command/address CMD/ADDR at the time point 807, which is three clocks after the enablement time point 806 of the chip select signal CS. However, since the memory device 410_1 has never performed an active operation, the memory device 410_1 may void the write command WT ordered through the command/address CMD/ADDR as illegal without performing the write operation. Furthermore, the memory device 410_1 may recognize the write command WT of the command/address CMD/ADDR at a time point 808, which is three clocks after the enablement time point 807 of the chip select signal CS. However, the memory device 410_1 may void the write command WT ordered through the command/address CMD/ADDR without performing the write operation.

As described with reference to FIG. 8, the CALs of the memory devices 410_0 and 410_1 may be set to satisfy the relation of dCAL tRCD and dCAL<tRP, which makes it possible to prevent malfunctions of the memory devices 410_0 and 410_1.

Figure 9:
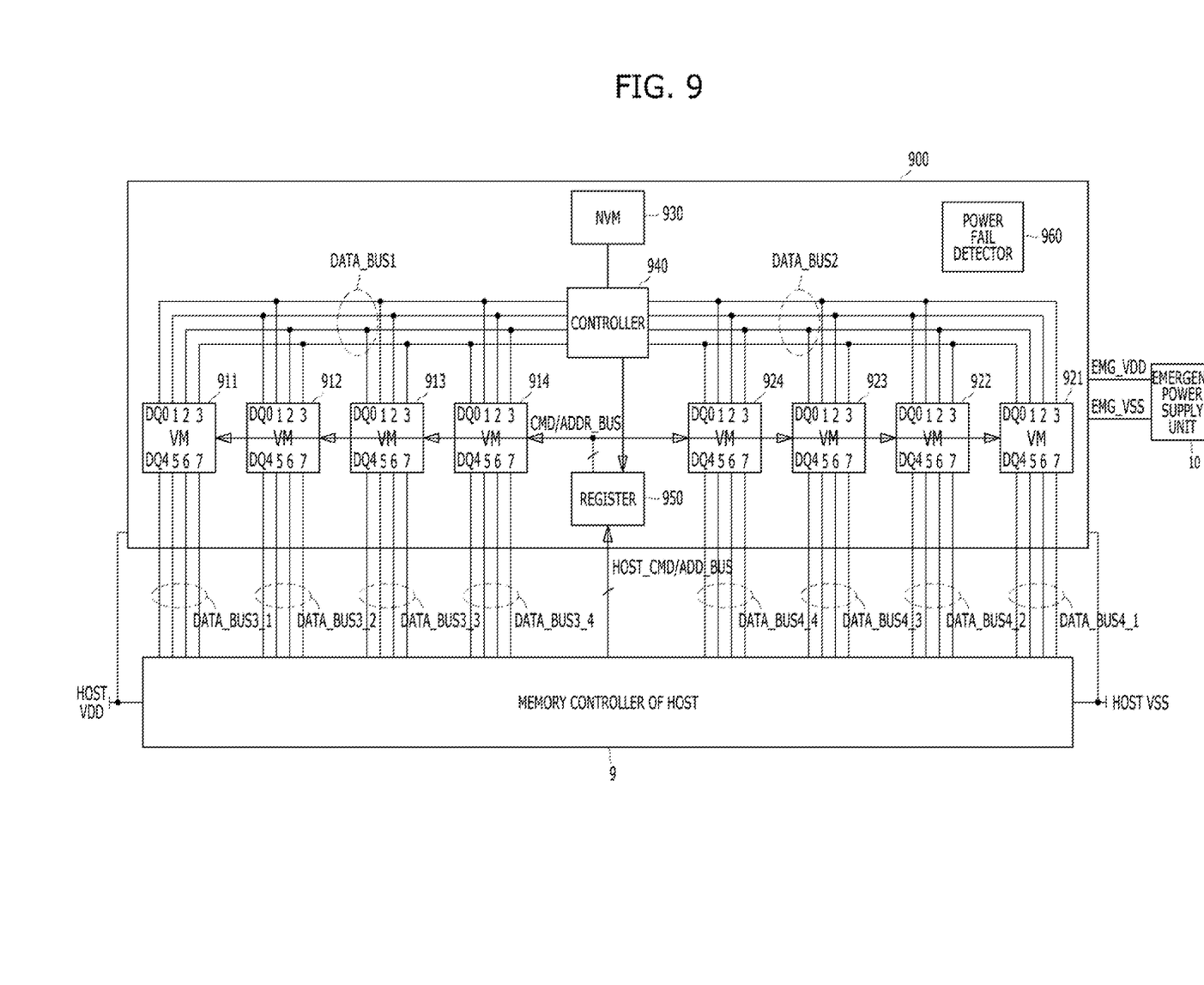
FIG. 9 is a block diagram illustrating a memory module in accordance with an embodiment of the present invention.

FIG. 9 is a block diagram illustrating a memory module 900 in accordance with an embodiment of the present invention. FIG. 9 illustrates an example in which the scheme for separately accessing memory devices sharing a data bus and a control bus by differently setting CALs of the memory devices is applied to the memory module 900. FIG. 9 illustrates a memory controller 9 and an emergent power supply unit 10 in addition to the memory module 900. The memory module 900 may include an NVDIMM (Non Volatile Dual In Line Memory Module). The NVDIMM may back up data of volatile memory devices when power of a host is unstable, thereby preventing data loss during power failure.

Referring to FIG. 9, the memory module 900 may include a plurality of first volatile memory devices 911 to 914, a plurality of second volatile memory devices 921 to 924, a nonvolatile memory device 930, a controller 940, a register 950, a power fail detector 960, a first data bus DATA_BUS1, a second data bus DATA_BUS2, a control bus CMD/ADDR_BUS, a plurality of third data buses DATA_BAS3_1 to DATA_BUS3_4, and a plurality of fourth data buses DATA_BUS4_1 to DATA_BUS4_4.

When host power HOST_VDD and HOST_VSS is normal, the register 950 may buffer a command, address, and a clock provided from the memory controller 9 of the host through a host control bus HOST_CMD/ADDR_BUS, and provide the buffered command, address, and clock to the first volatile memory devices 911 to 914 and the second volatile memory devices 921 to 924 through the control bus CMD/ADDR_BUS. When the host power HOST_VDD and HOST_VSS is normal, the first volatile memory devices 911 to 914 may exchange data with the memory controller 9 of the host through corresponding third data buses among the third data buses DATA_BUS3_1 to DATA_BUS3_4, and the second volatile memory devices 921 to 924 may exchange data with the memory controller 9 of the host through corresponding fourth data buses among the fourth data buses DATA_BUS4_1 to DATA_BUS4_4. That is, when the host power HOST_VDD and HOST_VSS is normal, the first volatile memory devices 911 to 914 and the second volatile memory devices 921 to 924 may communicate with the memory controller 9 of the host through corresponding data buses among the third data buses DATA_BUS3_1 to DATA_BUS3_4 and the fourth data buses DATA_BUS4_1 to DATA_BUS4_4.

When detecting a failure of the host power HOST_VDD and HOST_VSS or it is detected that the levels of voltages forming the host power HOST_VDD and HOST_VSS are destabilized, the power fail detector 960 may cut off the supply of the host power HOST_VDD and HOST_VSS, and operate the memory module 900 using emergent power EMG_VDD and MEG_VSS of the emergent power supply unit 10. The emergent power supply unit 10 may be implemented with a capacitor having a large capacitance, for example, a super cap. The emergent power supply unit 10 may supply the emergent power EMG_VDD and EMG_VSS while data of the first volatile memory devices 911 to 914 and the second volatile memory devices 921 to 924 are backed up into the nonvolatile memory device 930. FIG. 9 exemplarily illustrates that the emergent power supply unit 10 is provided outside the memory module 900. However, the emergent power supply unit 10 may be provided in the memory module 900. When detecting a failure of the host power HOST_VDD and HOST_VSS, the power fail detector 960 may notify the controller 940 of the failure.

When the failure of the host power HOST_VDD and HOST_VSS is notified from the power fail detector 960, the control for the first volatile memory devices 911 to 914 and the second volatile memory devices 921 to 924 may be switched to the controller 940 from the memory controller 9 of the host. The register 950 may buffer the command, address, and clock provided from the controller 940 in place of the memory controller 9 of the host, and may provide the buffered command, address, and clock to the first volatile memory devices 911 to 914 and the second volatile memory devices 921 to 924 through the control bus CMD/ADDR_BUS. The first volatile memory devices 911 to 914 may exchange data with the controller 940 through the first data bus DATA_BUS1, and the second volatile memory devices 921 to 924 may exchange data with the controller 940 through the second data bus DATA_BUS2. The controller 940 may read the data of the first volatile memory devices 911 to 914 and the second volatile memory devices 921 to 924 through the control bus CMD/ADDR_BUS, the first data bus DATA_BUS1, and the second data bus DATA_BUS2, and back up the read data into the nonvolatile memory device 930.

The data of the first volatile memory devices 911 to 914 and the second volatile memory devices 921 to 924, which are backed up into the nonvolatile memory device 930 when a failure of the host power HOST_ADD and HOST_VSS occurs, may be transmitted to the first volatile memory devices 911 to 914 and the second volatile memory devices 921 to 924 after the host power HOST_VDD and HOST_VSS is restored. Such a restoration operation may be performed according to the control of the controller 940. After the restoration operation is completed, the control for the first volatile memory devices 911 to 914 and the second volatile memory devices 921 to 924 may be switched to the memory controller 9 of the host from the controller 940.

Between the controller 940 and the first volatile memory devices 911 to 914, there is provided only the control bus CMD/ADDR_BUS and the first data bus DATA_BUS1. That is, the first volatile memory devices 911 to 914 may share the same control bus and data bus for communication with the controller 940. Similarly, between the controller 940 and the second volatile memory devices 921 to 924, there is provided only the control bus CMD/ADDR_BUS and the second data bus DATA_BUS2. That is, the second volatile memory devices 921 to 924 may share the same control bus and data bus for communication with the controller 940. However, the controller 940 can independently access the first volatile memory devices 911 to 914, and independently access the second volatile memory devices 921 to 924. This operation will be described in detail with reference to FIG. 10.

The first volatile memory devices 911 to 914 and the second volatile memory devices 921 to 924 may include DRAM or different types of volatile memory devices. The nonvolatile memory device 930 may include NAND FLASH. However, the nonvolatile memory device 930 is not limited thereto, but may include all types of nonvolatile memory devices, for example, NOR FLASH, Resistive RAM (RRAM), Phase RAM (PRAM), Magnetic RAM (MRAM), or Spin Transfer Torque MRAM (STT-MRAM).

The components within the memory module 900 illustrated in FIG. 9 may be integrated with each other or separated from each other. For example, the controller 940, the register 950, and the power fail detector 960 may be implemented as a single chip or implemented as a plurality of chips. The number of first volatile memory devices 911 to 914, second volatile memory devices 921 to 924, and the nonvolatile memory device 930 included in the memory module 900 may vary.

Figure 10:
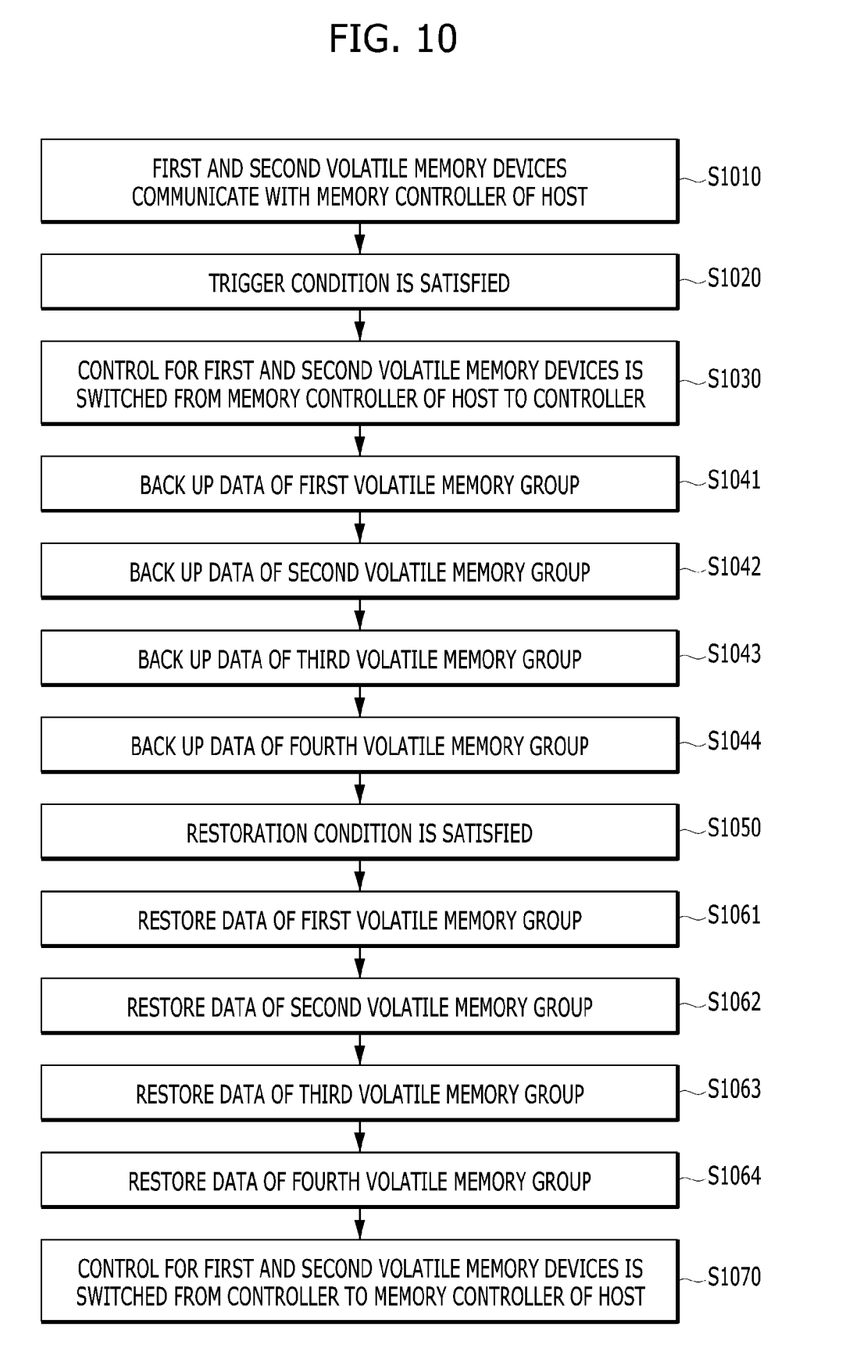
FIG. 10 is a flowchart illustrating an operation of the memory module illustrated in FIG. 9.

FIG. 10 is a flowchart illustrating the operation of the memory module 900 described with reference to FIG. 9.

Referring to FIG. 10, at step S1010, the first volatile memory devices 911 to 914 and the second volatile memory devices 921 to 924 may communicate with the memory controller 9 of the host. Since the first volatile memory devices 911 to 914 and the second volatile memory devices 921 to 924 share the same control bus CMD/ADDR_BUS, the first volatile memory devices 911 to 914 and the second volatile memory devices 921 to 924 may perform the same operation. However, since separate data buses DATA_BUS3_1 to DATA_BUS3_4 and DATA_BUS4_1 to DATA_BUS4_4 are provided for the respective volatile memory devices 911 to 914 and 921 to 924, the memory controller 9 of the host can exchange different data with each of the volatile memory devices 911 to 914 and 921 to 924.

At step S1020, a trigger condition may be satisfied. The trigger condition may indicate a condition for backing up the data of the first volatile memory devices 911 to 914 and the second volatile memory devices 921 to 924 into the nonvolatile memory device 930. For example, when a failure of the host power HOST_VDD and HOST_VSS is detected, the failure detection may satisfy the trigger condition. Alternatively, when a backup operation is performed by a command of the memory controller 9 of the host, the backup operation command of the memory controller 9 of the host may satisfy the trigger condition.

At step S1030, the control for the first volatile memory devices 911 to 914 and the second volatile memory devices 921 to 924 may be switched from the memory controller 9 of the host to the controller 940. Furthermore, the power used by the memory module 900 may be switched from the host power HOST_VDD and HOST_VSS to the emergent power EMG_VDD and EMG_VSS supplied by the emergent power supply unit 10. Furthermore, according to the control of the controller 940, the data buses used by the first volatile memory devices 911 to 914 may be switched from the third data buses DATA_BUS3_1 to DATA_BUS3_4 to the first data bus DATA_BUS1, and the data buses used by the second volatile memory devices 921 to 924 may be switched from the fourth data buses DATA_BUS4_1 to DATA_BUS4_4 to the second data bus DATA_BUS2. Each of the first volatile memory devices 911 to 914 and the second volatile memory devices 921 to 924 may include eight data pads DQ0 to DQ7. Among the data pads DQ0 to DQ7, four data pads DQ0 to DQ3 may be coupled to the first data bus DATA_BUS1 and the second data bus DATA_BUS2, and the other four data pads DQ4 to DQ7 may be coupled to the third data buses DATA_BUS3_1 to DATA_BUS3_4 and the fourth data buses DATA_BUS4_1 to DATA_BUS4_4. The data buses used by the first volatile memory devices 911 to 914 and the second volatile memory devices 921 to 924 may be changed in response to a command of the controller 940. The zeroth data pads DQ0 of the first volatile memory devices 911 to 914 may be coupled to different data lines of the first data bus DATA_BUS1, and the zeroth data pads DQ0 of the second volatile memory devices 921 to 924 may be coupled to different data lines of the second data DATA_BUS2. Through this configuration, the first volatile memory devices 911 to 914 may individually enter the PDA mode, and the second volatile memory devices 921 to 924 may individually enter the PDA mode.

At step S1041, the data of the first volatile memory device 911 and the second volatile memory device 921 (hereafter referred to as a first volatile memory group) may be backed up into the nonvolatile memory device 930. This operation may be performed as follows. First, the CAL of the first volatile memory group 911 and 921 may be set to a first value (for example, '0'), and the CAL of the other volatile memory devices 912 to 914 and 922 to 924 may be set to a second value (for example, '3'), which is different from the first value. Then, the controller 940 may read data from the first volatile memory group 911 and 921 using the CAL of the first value, and store the read data in the nonvolatile memory device 930.

At step S1042, the data of the first volatile memory device 912 and the second volatile memory device 922 (hereafter referred to as a second volatile memory group) may be backed up into the nonvolatile memory device 930. This operation may be performed as follows. First, the CAL of the second volatile memory group 912 and 922 may be set to the first value (for example, '0'), and the CAL of the other volatile memory devices 911, 913, and 914 and 921, 923, and 924 may be set to the second value (for example, '3'). Then, the controller 940 may read data from the second volatile memory group 912 and 922 using the CAL of the first value, and store the read data in the nonvolatile memory device 930.

At step S1043, the data of the first volatile memory device 913 and the second volatile memory device 923 (hereafter referred to as a third volatile memory group) may be backed up into the nonvolatile memory device 930. This operation may be performed as follows. First, the CAL of the third volatile memory group 913 and 923 may be set to the first value (for example, '0'), and the CAL of the other volatile memory devices 911, 912, and 914 and 921, 922, and 924 may be set to the second value (for example, '3'). Then, the controller 940 may read data from the third volatile memory group 913 and 923 using the CAL of the first value, and store the read data in the nonvolatile memory device 930.

At step S1044, the data of the first volatile memory device 914 and the second volatile memory device 924 (hereafter referred to as a fourth volatile memory group) may be backed up into the nonvolatile memory device 930. This operation may be performed as follows. First, the CAL of the fourth volatile memory group 914 and 924 may be set to the first value (for example, '0'), and the CAL of the other volatile memory devices 911 to 913 and 921 to 923 may be set to the second value (for example, '3'). Then, the controller 940 may read data from the fourth volatile memory group 914 and 924 using the CAL of the first value, and store the read data in the nonvolatile memory device 930. The backup operation may be completed by step S1044.

The method in which the controller 940 sets the CALs of the first volatile memory devices 911 to 914 and the second volatile memory devices 921 to 924 in various manners and accesses only first and second volatile memory devices having specific CAL at steps S1041 to S1044 may be understood with reference to FIGS. 4 to 7. Furthermore, as described with reference to FIG. 9, the CAL difference dCAL between the first and second values of CAL may be set to satisfy the relation of dCAL≥tRCD and dCAL<tRP.

After the backup operation is completed, a restoration condition may be satisfied at step S1050. The restoration condition may indicate a condition for restoring the data, which is backed up in the nonvolatile memory device 930, to the first volatile memory devices 911 to 914 and the second volatile memory devices 921 to 924. For example, when the host power HOST_VDD and HOST_VSS is normally restored, it may satisfy the restoration condition. Alternatively, when the restoration operation is performed in response to a command of the memory controller 9 of the host, the restoration operation command of the memory controller 9 of the host may satisfy the restoration condition. Since the host power HOST_VDD and HOST_VSS is normally restored, the following restoration operation may be performed using the host power HOST_VDD and HOST_VSS.

At step S1061, the data of the first volatile memory group 911 and 921 may be restored. This operation may be performed as follows. First, the CAL of the first volatile memory group 911 and 921 may be set to a third value (for example, '0'), and the CAL of the other volatile memory devices 912 to 914 and 922 to 924 may be set to a fourth value (for example, '3'), which is different from the third value. Then, the controller 940 may read data from the nonvolatile memory device 930, and write the read data to the first volatile memory group 911 and 921.

At step S1062, the data of the second volatile memory group 912 and 922 may be restored. This operation may be performed as follows. First, the CAL of the first volatile memory group 912 and 922 may be set to the third value, and the CAL of the other volatile memory devices 911, 913, and 914 and 921, 923, and 924 may be set to the fourth value. Then, the controller 940 may read data from the nonvolatile memory device 930, and write the read data to the second volatile memory group 912 and 922.

At step S1063, the data of the third volatile memory group 913 and 923 may be restored. This operation may be performed as follows. First, the CAL of the third volatile memory group 913 and 923 may be set to the third value, and the CAL of the other volatile memory devices 911, 912, and 914 and 921, 922, and 924 may be set to the fourth value. Then, the controller 940 may read data from the nonvolatile memory device 930, and write the read data to the third volatile memory group 913 and 923.

At step S1064, the data of the fourth volatile memory group 914 and 924 may be restored. This operation may be performed as follows. First, the CAL of the fourth volatile memory group 914 and 924 may be set to the third value, and the CAL of the other volatile memory devices 911 to 913 and 921 to 923 may be set to the fourth value. Then, the controller 940 may read data from the nonvolatile memory device 930, and write the read data to the fourth volatile memory group 914 and 924. The restoration operation may be completed by step S1064.

After the restoration operation is completed, the control for the first volatile memory devices 911 to 914 and the second volatile memory devices 921 to 924 may be switched from the controller 940 to the memory controller 9 of the host, at step S1070. Furthermore, the data bus used by the first volatile memory devices 911 to 914 may be switched from the first data bus DATA_BUS1 to the third data buses DATA_BUS3_1 to DATA_BUS3_4, and the data bus used by the second volatile memory devices 921 to 924 may be switched from the second data bus DATA_BUS2 to the fourth data buses DATA_BUS4_1 to DATA_BUS4_4.

As described above, the first volatile memory devices 911 to 914 may share the control bus CMD/ADDR_BUS and the first data bus DATA_BUS1 for communication with the controller 940. However, as the controller 940 sets the CAL to different values, the controller 940 may separately access the first volatile memory devices 911 to 914 in order to back up or restore data. Furthermore, the second volatile memory devices 921 to 924 may share the control bus CMD/ADDR_BUS and the second data bus DATA_BUS2 for communication with the controller 940. However, as the controller 940 sets the CAL to different values, the controller 940 may separately access the second volatile memory devices 921 to 924 in order to back up or restore data.

Figure 11:
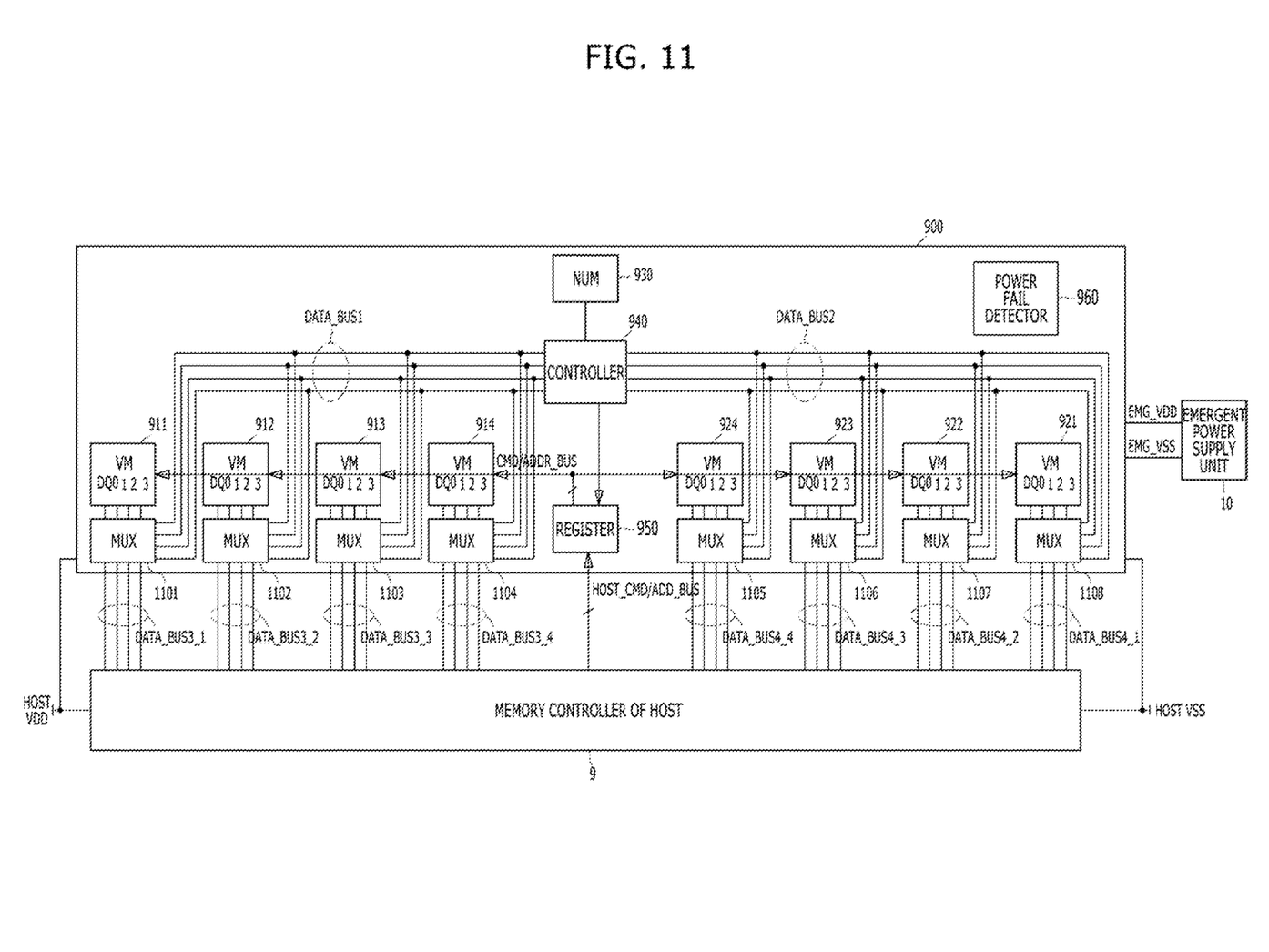
FIG. 11 is a block diagram illustrating a memory module in accordance with another embodiment of the present invention.

FIG. 11 is a block diagram illustrating the memory module 900 in accordance with another embodiment of the present invention.

Referring to FIGS. 9 and 11, the memory module 900 shown in FIG. 11 may be substantially the same as the memory module 900 described with reference to FIG. 9 except that the memory module shown in FIG. 11 may further include multiplexers 1101 to 1108, and four data pads DQ0 to DQ3 may be used in the first volatile memory devices 911 to 914 and the second volatile memory devices 921 to 924.

When the first volatile memory devices 911 to 914 communicate with the memory controller 9 of the host, the data pads DQ0 to DQ3 of the first volatile memory devices 911 to 914 may be coupled to the third data buses DATA_BUS3_1 to DATA_BUS3_4 by the multiplexers 1101 to 1104. When the first volatile memory devices 911 to 914 communicate with the controller 940, the data pads DQ0 to DQ3 of the first volatile memory devices 911 to 914 may be coupled to the first data bus DATA_BUS1 by the multiplexers 1101 to 1104.

When the second volatile memory devices 921 to 924 communicate with the memory controller 9 of the host, the data pads DQ0 to DQ3 of the second volatile memory devices 921 to 924 may be coupled to the fourth data buses DATA_BUS4_1 to DATA_BUS4_4 by the multiplexers 1105 to 1108. When the second volatile memory devices 921 to 924 communicate with the controller 940, the data pads DQ0 to DQ3 of the second volatile memory devices 921 to 924 may be coupled to the second data bus DATA_BUS2 by the multiplexers 1105 to 1108.

In accordance with the embodiments of the present invention, while the number of lines between the controller and the memory devices are reduced, the controller can separately access the memory devices.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a data bus configured to transfer data;
   a control bus configured to transfer a command and address including a command address latency (CAL);
   first and second memory devices coupled to the data bus and the control bus; and
   a controller configured to control the first and second memory devices through the data bus and the control bus,
   wherein the first and second memory devices have different values of the CAL, and
   wherein a difference of the CAL values is greater than or equal to a RAS to CAS delay time (tRCD).

2. The memory system of claim 1, wherein the difference of the CAL values is smaller than a row precharge time (tRP).

3. A memory module comprising:
   a first data bus configured to transfer data;
   a control bus configured to transfer a command and address including a command address latency (CAL);
   a plurality of first volatile memory devices coupled to the first data bus and the control bus;
   one or more nonvolatile memory devices; and
   a controller configured to provide the command and address through the control bus and the first data bus to store data of the plurality of first volatile memory devices into the nonvolatile memory devices when a trigger condition is satisfied,
   wherein when the trigger condition is satisfied, the controller controls a specific one of the plurality of first volatile memory devices to have the CAL of a first value, and others of the plurality of first volatile memory devices to have the CAL of a second value.

4. The memory module of claim 3, wherein the command and address include the CAL of the first value when the controller accesses the specific one of the plurality first volatile memory devices.

5. The memory module of claim 3, further comprising:
a second data bus configured to transfer data; and
a plurality of second nonvolatile memory devices coupled to the second data bus and the control bus,
wherein the controller further provides the command and address through the control bus and the second data bus to store data of the plurality of second volatile memory devices into the nonvolatile memory devices, when the trigger condition is satisfied, and
wherein when the trigger condition is satisfied, the controller controls a specific one of the plurality of second volatile memory devices to have the CAL of the first value, and others of the plurality of second volatile memory devices to have the CAL of a second value.

6. The memory module of claim 5, wherein the command and address include the CAL of the first value when the controller accesses the specific one of the plurality of second volatile memory devices.

7. The memory module of claim 5, further comprising a plurality of third data buses through which the plurality of first volatile memory devices independently perform data communication with a memory controller of a host.

8. The memory module of claim 7, further comprising a plurality of fourth data buses through which the plurality of second volatile memory devices independently perform data communication with the memory controller of the host.

9. The memory module of claim 3, wherein the second value is greater than the first value, and a difference between the first and second values is greater than or equal to a RAS to CAS delay time (tRCD).

10. The memory module of claim 9, wherein the difference between the first and second values is smaller than a row precharge time (tRP).

11. The memory module of claim 3, further comprising a register configured to transfer a command and address between a memory controller of a host and the control bus.

12. An operation method of a memory module including first to Nth volatile memory groups, each of the first to Nth volatile memory groups includes one or more volatile memory devices, one or more nonvolatile memory devices, and a controller, the operation method comprising:
exchanging data between the first to Nth volatile memory groups and a memory controller of a host;
controlling, by the controller, a specific one of the first to Nth volatile memory groups to have a command address latency (CAL) of a first value, and others of the first to Nth volatile memory groups to have the CAL of a second value when a trigger condition is satisfied; and
providing a command and address including the CAL of the first value to store data of the specific one of the first to Nth volatile memory groups into the nonvolatile memory devices when the trigger condition is satisfied.

13. The operation method of claim 12, further comprising repeating the controlling of the CAL of the first and second values and the providing of the command and address including the CAL of the first value for each of the first to Nth volatile memory groups.

14. The operation method of claim 12, further comprising:
controlling, by the controller, the specific one of the first to Nth volatile memory groups to have the CAL of a third value, and the others of the first to Nth volatile memory groups to have the CAL of a fourth value when a restoration condition is satisfied; and
providing a command and address including the CAL of the third value to restore data of the nonvolatile memory devices into the specific one of the first to Nth volatile memory groups when the restoration condition is satisfied.

15. The operation method of claim 14, further comprising repeating the controlling of the CAL of the third and fourth values and the providing of the command and address including the CAL of the third value for each of the first to Nth volatile memory groups.

16. The operation method of claim 14, wherein the fourth value is greater than the third value, and a difference between the third and fourth values is greater than or equal to a RAS to CAS delay time (tRCD).

17. The operation method of claim 16, wherein the difference between the third and fourth values is smaller than a row precharge time (tRP).

18. The operation method of claim 12, wherein the second value is greater than the first value, and a difference between the first and second values is greater than or equal to a RAS to CAS delay time (tRCD).

19. The operation method of claim 18, wherein the difference between the first and second values is smaller than a row precharge time (tRP).

* * * * *